United States Patent
Griffin

(10) Patent No.: US 8,618,959 B2
(45) Date of Patent: Dec. 31, 2013

(54) SWITCHING CIRCUITRY AND SWITCHING SYSTEM

(75) Inventor: Ian Griffin, Bristol (GB)

(73) Assignee: STMicroelectronics (Research & Development) Limited, Buckinghamshire (GB)

( * ) Notice: Subject to any disclaimer, the term of this patent is extended or adjusted under 35 U.S.C. 154(b) by 1218 days.

(21) Appl. No.: 12/150,113

(22) Filed: Apr. 23, 2008

(65) Prior Publication Data

US 2008/0258950 A1  Oct. 23, 2008

(30) Foreign Application Priority Data

Apr. 23, 2007 (EP) ..................................... 07251681

(51) Int. Cl.
*H03K 17/94* (2006.01)

(52) U.S. Cl.
USPC ............................................ 341/22; 341/126

(58) Field of Classification Search
USPC .................................................. 341/22, 126
See application file for complete search history.

(56) References Cited

U.S. PATENT DOCUMENTS

| | | | |
|---|---|---|---|
| 4,918,634 A * | 4/1990 | Nishimori | 708/142 |
| 4,973,979 A * | 11/1990 | Ikeda | 341/154 |
| 5,371,498 A * | 12/1994 | Kwon et al. | 341/24 |
| 5,619,196 A * | 4/1997 | Escobosa | 341/22 |
| 5,929,790 A * | 7/1999 | Lim | 341/22 |
| 6,590,514 B2 * | 7/2003 | Suzuki | 341/144 |
| 7,026,973 B2 * | 4/2006 | Chu | 341/155 |
| 7,391,343 B2 * | 6/2008 | Ito | 341/22 |
| 2005/0184900 A1 | 8/2005 | Chu | |
| 2008/0024326 A1 * | 1/2008 | DiFatta et al. | 341/22 |

FOREIGN PATENT DOCUMENTS

| | | |
|---|---|---|
| BE | 1009684 | 7/1997 |
| EP | 0579912 | 1/1994 |
| EP | 0895362 | 2/1999 |

OTHER PUBLICATIONS

European Search Report dated Oct. 28, 2011 in connection with European Patent Application No. 11168710.9; 6 pages.

* cited by examiner

*Primary Examiner* — Rexford Barnie
*Assistant Examiner* — Tien Mai

(57) ABSTRACT

Switching circuitry comprising a bank of actuatable switches connected in parallel between a supply terminal and a decoding terminal, each switch being connected in series with a component which, when the switch is actuated, applies to the second terminal an analog signal having a value unique to that switch.

20 Claims, 2 Drawing Sheets

SWITCHING CIRCUITRY AND SWITCHING SYSTEM

CROSS-REFERENCE TO RELATED APPLICATIONS

The present application is related to European Patent Application No. 07251681.8, filed Apr. 23, 2007, entitled "SWITCHING CIRCUITRY AND SWITCHING SYSTEM". European Patent Application No. 07251681.8 is assigned to the assignee of the present application and is hereby incorporated by reference into the present disclosure as if fully set forth herein. The present application hereby claims priority under 35 U.S.C. §119(a) to European Patent Application No. 07251681.8.

TECHNICAL FIELD

The present invention relates to switching circuitry and a switching system.

BACKGROUND

The present invention relates to a system where there is a requirement to identify from a bank of switches which switch or combination of switches has been actuated. One example is decoding front panel key switches of a set top box. Set top boxes include a front panel which has a number of different switches which can be separately actuated by a user. Currently, each switch has an input to a microprocessor for determining which switch has been actuated. The value at that input changes between zero and one depending on whether the switch is actuated or not. This requires a plurality of input signals into a microprocessor, with their corresponding package balls/pins.

SUMMARY

It is an aim of the present invention to reduce the number of input/output signals and corresponding package requirements for decoding which of a plurality of switches have been actuated.

According to one aspect of the present invention there is provided switching circuitry comprising a bank of actuatable switches connected in parallel between a supply terminal and a decoding terminal, each switch being connected in series with a component which, when the switch is actuated, applies to the decoding terminal an analog signal having a value unique to that switch.

In the described embodiment, the component is a resistor and the analog signal is a voltage.

Another aspect of the invention provides a switching system comprising: switching circuitry as defined above; means for monitoring the value of the analog signal at the decoding terminal; and means for decoding the value to indicate a combination of actuated switches wherein each combination of actuated switches applies a unique value to the decoding terminal.

It will be appreciated that the word "combination" though commonly used to denote more than one switch herein includes the case where a single switch is actuated and identified by a unique value.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
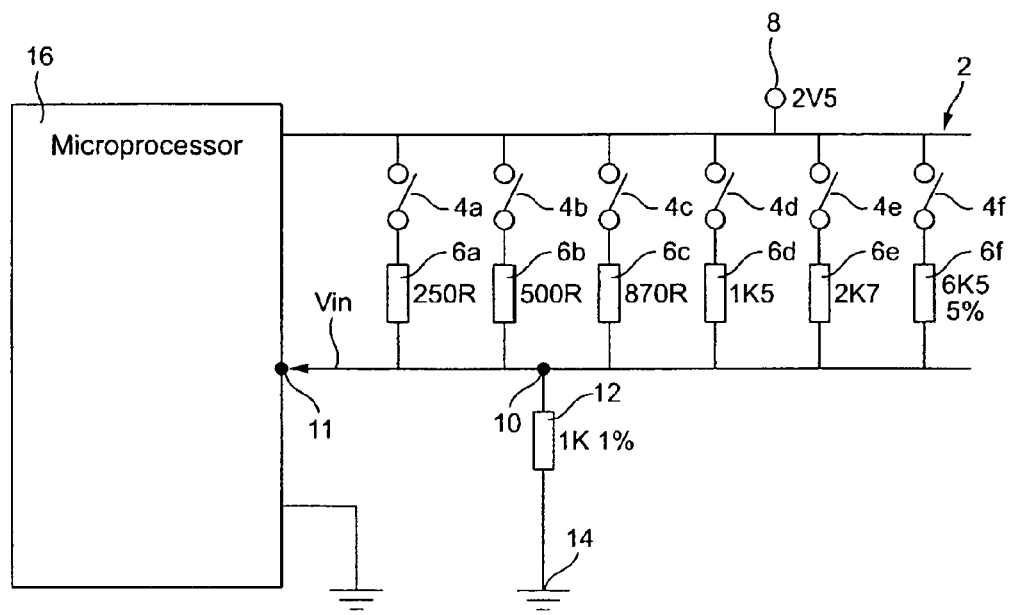
FIG. 1 is a schematic block diagram of a switching system.

FIG. 1 is a schematic diagram of a switching system in accordance with one embodiment of the present invention. A bank of switches 2 comprises a plurality of switching paths, each including a switch 4a . . . 4f and a resistor 6a . . . 6f in series therewith. The switching paths are arranged in parallel between a supply terminal 8 and a decoding terminal 10. A further resistor 12 is connected between a decoding terminal 10 and a second supply terminal 14. In this case, the first supply terminal has a positive voltage and the second supply terminal is ground, but it will be appreciated that any arrangement of voltages can be used.

Reference numeral 16 denotes a microprocessor which in the embodiment of FIG. 1 takes its supply from the voltage terminal 8 and has a decoding input 11 for receiving an analog voltage $V_{in}$ the decoding terminal 10.

Figure 2:
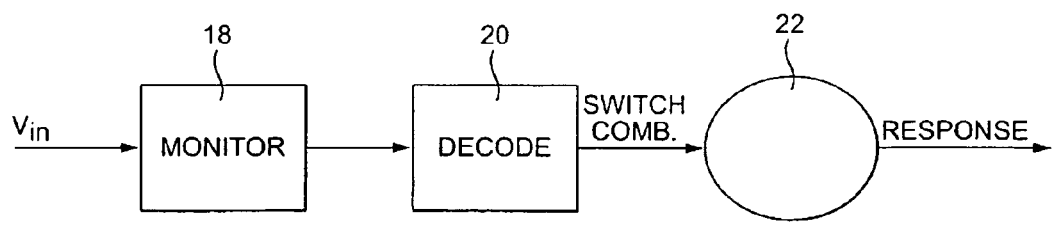
FIG. 2 is a schematic block diagram illustrating functions of a microprocessor in the system.

The functions implemented by the microprocessor which are applied to the voltage $V_{in}$ at the decoding terminal 11 are shown schematically in FIG. 2. In FIG. 2 these functions are shown as blocks, but it will be appreciated that they can be implemented in any appropriate manner. For example they could be implemented as code sequences run by the microprocessor 16 which constitutes the main microprocessor of the system. Alternatively, as discussed more fully below, they can be implemented by an FSM (Finite State Machine) or small co-processor to take the load off the main microprocessor.

In any event, a monitoring function 18 receives the analog voltage $V_{in}$ and determines when it changes, subject to appropriate debouncing. The monitoring function outputs a digital value representing the changed, debounced analog value. Thus an A-D conversion takes place in the monitor function. The digital value is supplied to a decoding function 20 which determines the combination of switches corresponding to the value as described below. The decoding function 20 outputs to a program being executed on the microprocessor the combination of switches which has been actuated to give rise to the voltage $V_{in}$. The program is denoted 22 in FIG. 2, and provides a response based on the actuated combination of switches.

Reverting to FIG. 1, each resistor has a unique value which means that a unique different voltage $V_{in}$ is generated at the decoding terminal 11 depending upon which combination of switch/switches is/are simultaneously actuated. In the described embodiment the values are as follows, but it will be appreciated that any unique values which have the effect that a unique voltage is generated for each combination of switches can be used to implement the invention.

| | |
|---|---|
| 6a | 250 Ohms |
| 6b | 500 Ohms |
| 6c | 870 Ohms |
| 6d | 1.5 kOhms |
| 6e | 2.7 kOhms |
| 6f | 6.5 kOhms |
| 12 | 1 kOhm |

Figure 3:
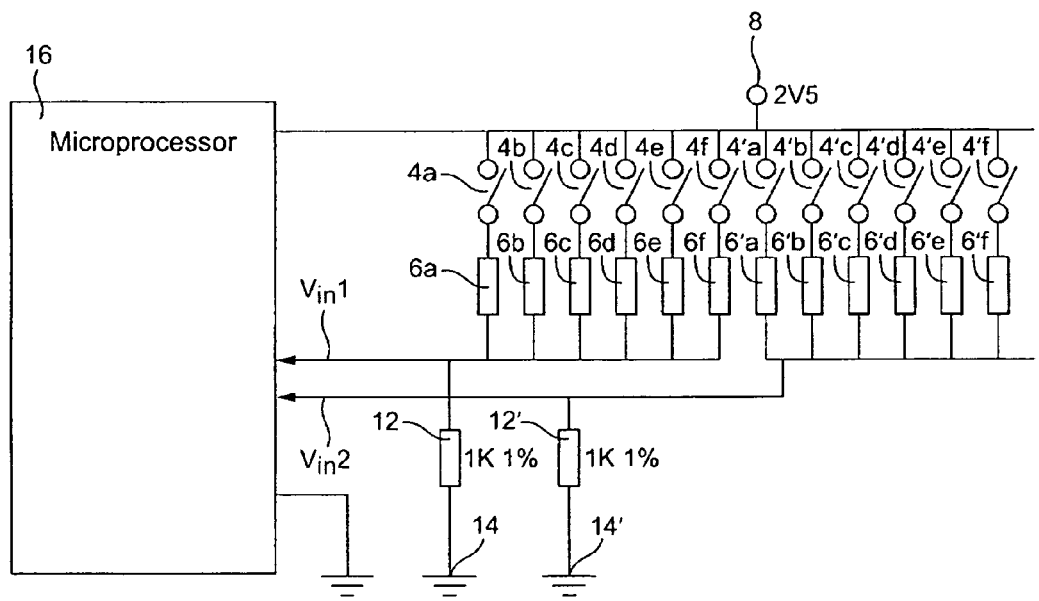
FIG. 3 is a schematic block diagram of an alternative embodiment of a switching system.

In fact the resistor values selected in FIG. 1 and FIG. 3 and as listed above only allow a maximum of two switches to be simultaneously actuated for each decoding terminal 11, but has the advantage of producing a linear voltage difference between each of the voltages produced on decoding terminal 11 for each individual switch that is actuated. This allows a large voltage guard-band between the switches for the decode function and can easily tolerate noise voltages on $V_{in}$. If it is required to be able to decode more than two switches simultaneously actuated, then binary weighted values for the resistors should be chosen. E.g. 250 Ohms, 500 Ohms, 1000 Ohms, 2000 Ohms, 4000 Ohms, 8000 Ohms.

It will readily be appreciated that the value of the voltage $V_{in}$ is determined by the resistances 6a-6f in parallel, of the actuated switches in a voltage divider completed by the resistor 12.

The use of resistors of unique values in series with the switches has the effect that an increasing voltage difference is produced as each switch is actuated, so that it is possible to read an analog value at a single input (decoding input 11), rather than having to read binary (on/off) signals at a plurality of inputs associated respectively with the switches.

In principle, any number of switches can be read in this way at a single input. In fact, from a practical perspective there may be a limit to the number of switches which can be read depending upon the voltage input range of the monitoring function 18/decode function 20 and noise in the system. In those cases, the switches can be arranged in banks, each bank having a plurality n of switches connected to an associated decoding terminal. Such an arrangement is shown in FIG. 2. In FIG. 2, it is assumed that a first bank 2a of switches corresponds to those shown in FIG. 1, and a second bank 2b of switches is denoted with primed numerals corresponding to those parts in the first bank. The resistance values for the switches in the first bank 2a are the same as those in FIG. 1, whereas the resistance values for those switches in the second bank 2b are as follows:

| | |
|---|---|
| 6'a | 250 Ohms |
| 6'b | 560 Ohms |
| 6'c | 1.1 kOhms |
| 6'd | 2.1 kOhms |
| 6'e | 5.3 kOhms |
| 6'f | 6.5 kOhms |
| 12' | 1 kOhm |

Therefore the embodiment illustrated in FIG. 3 allows the switches to be monitored by duplicating two banks of six switches and having two decoding terminals for $V_{in1}$, $V_{in2}$. For monitoring two switches being pressed simultaneously in one bank, the code for this can be decoded by the decode function 20, which compares the voltage measured to a look-up table of voltage ranges corresponding to different switch combinations. Alternatively, for example, with twelve switches in two banks, switches that are allowed to be actuated together can be split into different banks to make the code resolution easier. Each decoding terminal has its own associated decode function.

Figure 4:
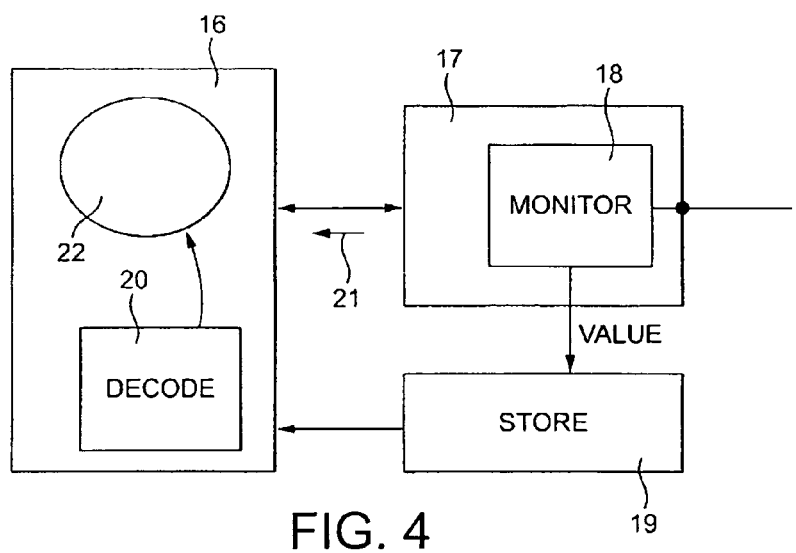
FIG. 4 is a schematic block diagram of an alternative arrangement of processors within a switching system.

In one embodiment, the main microprocessor can poll the decoding terminals 11 using its own software to debounce and decode the values to determine the actuated combination of switch or switches. Alternatively, as shown in FIG. 4, an FSM or small co-processor microprocessor 17 can be used to offload the task of monitoring the switches from the main microprocessor 16. This is particularly useful in embedded systems, for example set top boxes, running a non-real time operating system where the overhead of polling the decoding terminals and decoding the switches so as not to miss a switch actuation would be problematic. When a separate FSM or small co-processor 17 is used, running a real time operating system (RTOS), this can continually read the decoding terminals to detect whether or not the value on the terminal has changed due to actuation of the switches and latch the value into an appropriate store 19 such as a double buffered register or FIFO. This could then generate an interrupt 21 to the main microprocessor 16 which could then decode the value and respond to the switch actuation without missing the event.

It will be appreciated that the above-described embodiments of the invention could be used in many different contexts where switches are actuated. One application is the front panel of a set top box which provides a number of switches which can be pressed by a user, where different switch combinations have different interpretations for programs being executed in the set top box.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A switching circuitry, comprising:
   a first bank of selectively actuatable switches coupled between a supply terminal and a first decoding terminal, each switch connected in series with one of a first plurality of components to form a switching path, the switching paths formed by the first bank and the first plurality of components connected in parallel, the switching circuitry configured to apply to the first decoding terminal an analog signal having a first value dependent upon which switches within the first bank are actuated;
   a second bank of selectively actuatable switches coupled between the supply terminal and a second decoding terminal, each switch connected in series with one of a second plurality of components to form a switching path, the switching paths formed by the second bank and the second plurality of components connected in parallel, the switching circuitry configured to apply to the second decoding terminal an analog signal having a second value dependent upon which switches within the second bank are actuated; and a store configured to hold one or more patterns corresponding to the first and second values, wherein the store is updated when the first and second values change as a result of a change in which of the switches are actuated, wherein, when a plurality of the switches within the first bank and a plurality of the switches within the second bank are actuated in a combination, a relationship between the first and second values is unique to the combination of actuated switches.

2. The switching circuitry according to claim 1, wherein the components connected to the switches within the first and second banks each comprise a resistor, the resistor associated with each switch having a unique resistance value.

3. The switching circuitry according to claim 2, wherein the first and second signals each comprise a voltage.

4. The switching circuitry according to claim 2, wherein the first and second decoding terminals are each connected to a second supply terminal via a further resistor, and wherein a second supply voltage is applied to the second supply terminal.

5. The switching circuitry according to claim 1, wherein the analog signal values for the switches in the first bank correspond to the analog signal values for the switches in the second bank.

6. A switching system, comprising:
a switching circuitry comprising a bank of individually actuatable switches each connected in series with a component to form one of a plurality of switching paths between a supply terminal and a decoding terminal, the switching circuitry configured to apply to the decoding terminal an analog signal having a value unique to a combination of the switches that are actuated to be identified;
monitoring circuitry configured to monitor the value of the analog signal at the decoding terminal;
decoding circuitry configured to decode the analog signal; and
a store configured to hold a pattern corresponding to the decoded analog signal,
wherein the switching system is arranged to update the store in response to a determination that the value has changed as a result of a change in the switches that are actuated.

7. The switching system according to claim 6, comprising at least one further bank of actuatable switches with an associated further decoding terminal readable by the decoding circuitry.

8. The switching system according to claim 6, wherein the monitoring circuitry comprises analog to digital conversion circuitry operable to convert the analog signal value to a digital value.

9. The switching system according to claim 6, further comprising a central processing unit implementing the decoding circuitry and executing a program for receiving a decoded value from the decoding circuitry.

10. The switching system according to claim 6, comprising:
a co-processor implementing the monitoring circuitry.

11. The switching system according to claim 6, further comprising:

a second bank of individually actuatable switches each connected in series with a component to form a switching path between the supply terminal and a second decoding terminal, the switching system configured to apply to the second decoding terminal an analog signal having a value unique to a combination of the switches within the second bank that are actuated.

12. A set-top box including switching circuitry comprising:
a bank of actuatable switches coupled between a supply terminal and a decoding terminal, each switch connected in series with a component to form a switching path, the switching paths formed by the bank connected in parallel, the switching circuitry configured to apply to the decoding terminal an analog signal having a value dependent upon a combination of the switches that are actuated;
a monitoring circuit configured to monitor the value of the analog signal at the decoding terminal; and
a store configured to hold a pattern corresponding to the value, wherein the store is updated when the value change as a result of a change in which of the switches are actuated.

13. The set-top box according to claim 12, further comprising decoding circuitry and at least one further bank of actuatable switches with an associated further decoding terminal readable by the decoding circuitry.

14. The set-top box according to claim 13, comprising a central processing unit configured to implement the decoding circuitry and to execute a program for receiving a decoded value from the decoding circuitry.

15. The set-top box according to claim 12, wherein the monitoring circuitry is further configured to debounce the value, and wherein the monitoring circuitry comprises analog to digital conversion circuitry operable to convert the analog signal value to a digital value.

16. The set-top box according to claim 12, comprising:
a co-processor configured to implement the monitoring circuitry.

17. A method of operating switching circuitry comprising a first bank of selectively actuatable switches coupled in parallel between a supply terminal and a first decoding terminal, each switch connected in series with a component to form a switching path, the switching paths formed by the first bank connected in parallel, and a second bank of selectively actuatable switches coupled between the supply terminal and a second decoding terminal, each switch connected in series with a component to form a switching path, the switching paths formed by the second bank connected in parallel, the method comprising:
when a plurality of the switches within the first and second banks are actuated in a combination, receiving across the first and second decoding terminals an analog signal that has a value unique to the combination of actuated switches, enabling the plurality of actuated switches to be identified; and
storing one or more patterns corresponding to a first value from the first bank and a second value from the second bank, wherein the storing is updated when the first and second values change as a result of a change in which of the switches are actuated.

18. The method according to claim 17, wherein each of the components comprises a resistor, the resistor associated with each switch having a unique resistance value.

19. The method according to claim 18, wherein at least one of the decoding terminals is connected to a second supply terminal via a further resistor, and wherein a supply voltage is applied across the supply and second supply terminals.

20. The method according to claim 17, wherein the analog signal comprises a voltage.

* * * * *